United States Patent [19]
Dohnishi

[11] Patent Number: 5,844,778
[45] Date of Patent: Dec. 1, 1998

[54] HIGH-VOLTAGE ELECTRONIC DEVICE

[75] Inventor: Kiyoyuki Dohnishi, Kyoto, Japan

[73] Assignee: Murata Manufacturing Co., Ltd., Nagaokakyo, Japan

[21] Appl. No.: 907,916

[22] Filed: Aug. 11, 1997

Related U.S. Application Data

[63] Continuation of Ser. No. 604,455, Feb. 21, 1996, abandoned.

[30] Foreign Application Priority Data

Feb. 21, 1995 [JP] Japan ................................ 7-032524

[51] Int. Cl.⁶ ................................................. H05K 7/20
[52] U.S. Cl. ........................... 361/704; 174/52.2; 336/96; 361/600
[58] Field of Search ........................... 439/485; 174/16.3, 174/260, 52.2, DIG. 2; 336/65, 90, 96; 333/172; 165/80.3, 185; 338/226, 253, 275, 276; 361/674, 600, 622, 679, 688, 704, 707, 714, 715, 728

[56] References Cited

U.S. PATENT DOCUMENTS

| | | |
|---|---|---|
| 3,582,762 | 6/1971 | Mori .......................................... 322/28 |
| 3,880,491 | 4/1975 | Ferro ..................................... 339/112 R |
| 4,345,300 | 8/1982 | Stuckey .................................... 361/386 |
| 4,639,834 | 1/1987 | Mayer ...................................... 361/388 |
| 5,006,764 | 4/1991 | Swanson ................................. 315/276 |
| 5,075,821 | 12/1991 | McDonnal .............................. 361/386 |
| 5,266,739 | 11/1993 | Yamauchi .............................. 124/52.2 |
| 5,438,162 | 8/1995 | Thompson ............................. 174/52.2 |
| 5,448,216 | 9/1995 | Kuze ......................................... 336/90 |
| 5,526,234 | 6/1996 | Vinciaelli ................................ 174/52.2 |

*Primary Examiner*—Gerald P. Tolin
*Attorney, Agent, or Firm*—Burns, Doane, Swecker & Mathis, LLP

[57] ABSTRACT

An electrical element comprising a housing or casing, a heat generating part such as a high-tension resistor, a non-heat generating part such as a capacitor, and a resin filling the housing. Further, the electrical element also includes connectors for establishing external connections between the above-mentioned capacitor or high-voltage resistor, the connectors being arranged at positions suitable for them to dissipate heat from the high-voltage resistor and radiate heat outside the element.

4 Claims, 3 Drawing Sheets

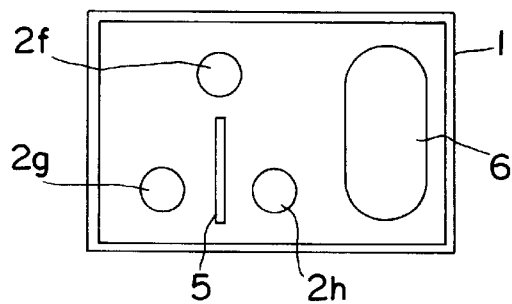
F I G. 6

HIGH-VOLTAGE ELECTRONIC DEVICE

This application is a continuation, of application Ser. No. 08/604,455, filed Feb. 21, 1996, as now abandoned.

BACKGROUND OF THE INVENTION

1. Field of the Invention

The present invention relates to an electrical element and more particularly to a heat resistant medium-filled high-voltage electrical element, such as a flyback transformer, comprising a heat generating part disposed in an insulating casing filled with a heat resistant medium such as an electrically insulating resin.

2. Description of Prior Art

A conventional resin-filled type high-voltage electrical element is shown in FIG. 7. This electrical element comprises a high-voltage resistor 21 and a capacitor 22 disposed in an insulating housing or casing 20 with the remaining portion of the interior of the casing being filled with a resin material. In this case, the high-voltage resistor 21 and the capacitor 22 are so arranged as to leave a sufficient space "d" therebetween in order to prevent the electrical properties of the capacitor 22 from being influenced by the heat transmitted from the high-voltage resistor 21. The structure of such a conventional electric element is, however, not advantageous for miniaturization.

Further, as shown in FIG. 8, there has also been proposed another resin-filled type high-voltage electric part similar to that shown in FIG. 7 wherein a clearance 23 in the form of a walled air gap is provided between the high-voltage resistor 21 and the capacitor 22. This electrical element is also not advantageous for miniaturization because of the existence of the clearance 23.

In the cases of these conventional high-voltage electrical elements, the space between each of the parts and the casing cannot be small since the space or clearance must be provided at a central portion of the casing. Further, the amount of the resin material to fill around the high-voltage resistor 21 differs along the outer surfaces of the high-voltage resistor 21, i.e., there is a variation in the thickness of the resin, which results in thermal stress. This thermal stress can reduce the capacitance of the capacitor and deteriorate the voltage-resistance property thereof.

SUMMARY OF THE INVENTION

According to the present invention, there is provided a compact resin-filled type high-voltage electrical element which has well-balanced internal thermal stress and which is excellent in its heat radiation capability.

According to the present invention, there is provided a heat resistant medium-filled type electrical element comprising a housing, a heat generating part disposed within the housing, at least one a connector connected to the heat generating part and a heat resistant medium filling the housing, wherein the connector is arranged close to the heat generating part while being accessible from outside the housing.

Further, according to the present invention, there is provided an electrical element of the above-described type wherein the connector is hollow.

Moreover, according to the present invention, there is provided an electrical element of the above-described type wherein the connector is cylindrical.

The high-voltage electrical element according to the present invention has inter alia the following various advantages.

Since the connector for connecting the heat generating part and other parts to related external parts is arranged around the heat generating part, the heat radiated from the heat generating part is dissipated by the connector so that the amount of heat radiation to the other parts is reduced.

By making the connector cylindrical, the heat emanated into the resin filler can be efficiently discharged outside the electrical element while occupying a small area in the element.

Further, by making the connector hollow, it is possible to facilitate the entry of air into the connector thereby increasing the heat discharging efficiency of the connector.

BRIEF DESCRIPTION OF THE DRAWINGS

FIG. 6 is a plan view of a heat resistant medium-filled type high-voltage electrical part according to a further embodiment of the present invention;

PREFERRED EMBODIMENTS OF THE INVENTION

Figure 1:
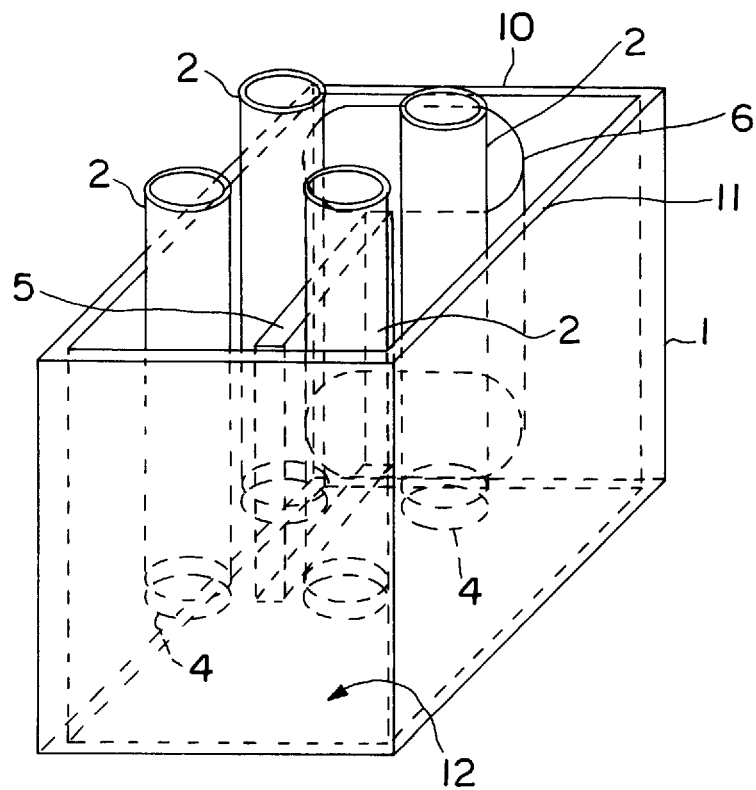
FIG. 1 is a perspective view of a heat resistant medium-filled type high-voltage electrical element according to one embodiment of the present invention.
Figure 2:
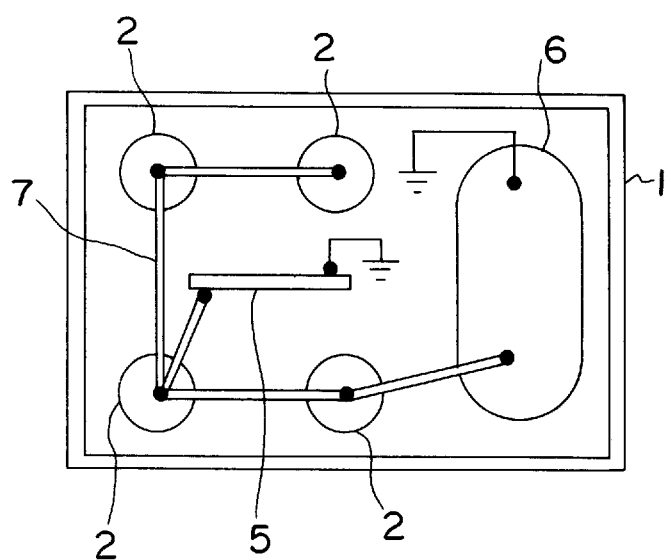
FIG. 2 is a bottom view of the heat resistant medium-filled type high-voltage electrical element shown in FIG. 1.

In FIGS. 1 and 2, there are disposed in an engineering plastic casing 1 a plurality of engineering plastic hollow cylindrical receptacles 2, a heat generating high-voltage resistor 5 manufactured by printing a glazing resistor on an alumina substrate and a non-heat generating capacitor 6. Any suitable engineering plastics can be used, such as Px9406 or 420SE0 from GE plastics, 500Z from Asahi Kasei Co., and 5010GN3 or 5010GN6 from Mitsubishi Engineering Plastics, all of which are electrically insulating materials.

To the bottom surface of each of the receptacles 2 there is bonded a connecting member 4 such as a metallic terminal, a conductive rubber member, a metallic spring, etc., for allowing the connector member 4 to be connected to an internal lead wire 7 (FIG. 2). If a conductive rubber member is used for the connecting member 4, a portion of the lead wire striped of its casing is pushed into and penetrates the conductive rubber member. The lead wire may include a conductive cap at the end of the casing to increase the relative contact area. A conductive cap is used at the end of the lead wire when either a non-clamping spring connector or metallic terminal is employed. A clamping spring connector can also be used to clamp a stripped end of the lead wire. The lead wire may have a bevelled washer mounted at the end of its casing for maintaining the end of the lead wire in the center of the hollow receptacles 4. Other connecting mechanisms will suggested themselves to those skilled in the art.

Figure 3:
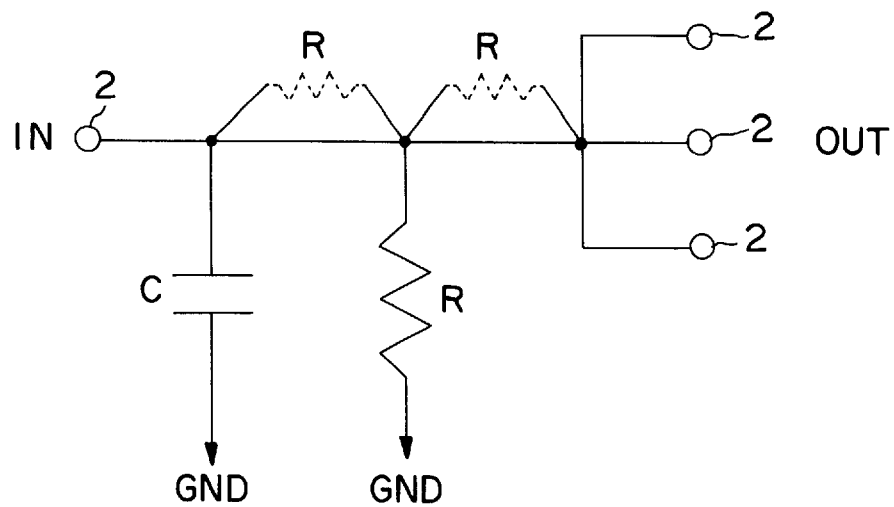
FIG. 3 is a circuit diagram of the heat medium-filled type high-voltage electrical element shown in FIG. 2.

FIG. 2 shows connections among the connector members 4, the high-voltage resistor 5 and the capacitor 6 by means of lead wires 7. FIG. 3 shows an equivalent circuit diagram. In this circuit, current controlling resistors R, designated by dotted lines, may be connected between an input connector member 4 and output connector members 4.

Into the casing 1, there is injected an engineering plastic insulating resin. The main purposes of the introduction of the resin is to provide electrical insulation between the components in the housing, to provide a mechanical strength of the device as a whole, so that all the parts in the casing are held fixed, and to prevent the components from being exposed to external gas or vapor. The resin can be of any suitable type, such as TCG 1150 A/B, TCG 1180 A/B or TCG 1186 A/B from Toshiba Chemical Co with thermal conductivities ranging from $10 \times 10^{-4}$ to $15 \times 10^{-4}$ cal./cm*sec.*deg. The resin is selected to conduct heat away from the heat generating parts while providing some thermal insulation to the non-heat generating parts.

In this case, each of the receptacles 2 is arranged so that a part thereof projects above the upper surface of the casing 1 thereby facilitating access to the receptacle 2 from outside the casing 1.

When the resulting electrical element is used, a lead wire for external connection is inserted into the hollow portion of each of the receptacles 2. The high-voltage resistor 5 is disposed in the casing 1 with its main (largest) surfaces held parallel to the main (largest) vertical walls 11 of the casing 1 thereby maximizing the heat transfer through the walls and reducing the amount of heat transfer to the capacitor 22, which is positioned at the end of the resistor 5. Further, in the embodiment shown in FIGS. 1 and 2, around the high-voltage resistor 5 there are arranged four receptacles 2 so that a quantity of the heat radiated from the high-voltage resistor 5 is discharged outside the element through the receptacles 2. The receptacles 2 are arranged symmetrically around the resistor 5 so that they transfer the heat radiated from the high-voltage resistor 5 equally in every direction. That is, as shown in FIG. 2, the receptacles 2 are arranged at the corners of an imaginary quadratic box surrounding the high-voltage resistor 5.

Each of the receptacles 2 is so arranged that the bottom of the connector is spaced apart from the bottom surface 12 of the casing 1.

Figure 4:
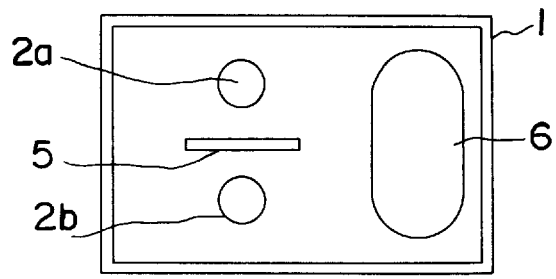
FIG. 4 is a circuit diagram of a heat resistant medium-filled type high-voltage electrical element according to another embodiment of the present invention.
Figure 5:
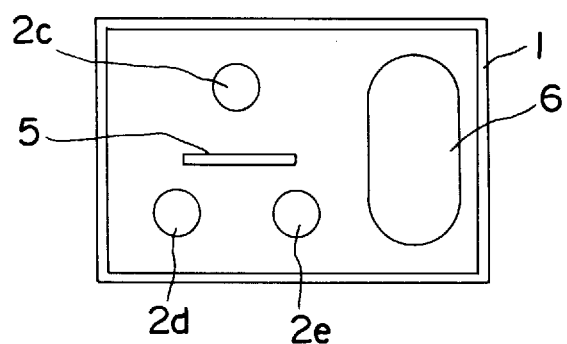
FIG. 5 is a plan view of a heat resistant medium-filled type high-voltage electrical element according to still another embodiment of the present invention.
Figure 7:
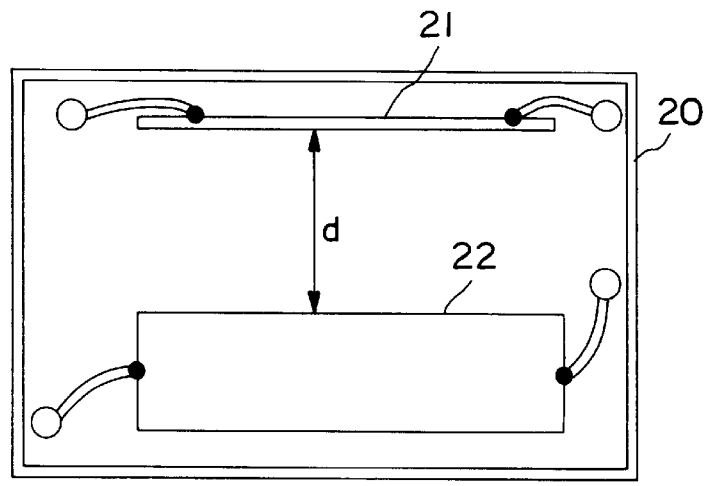
FIG. 7 is a plan view of a conventional heat resistant medium-filled type high-voltage electrical element.
Figure 8:
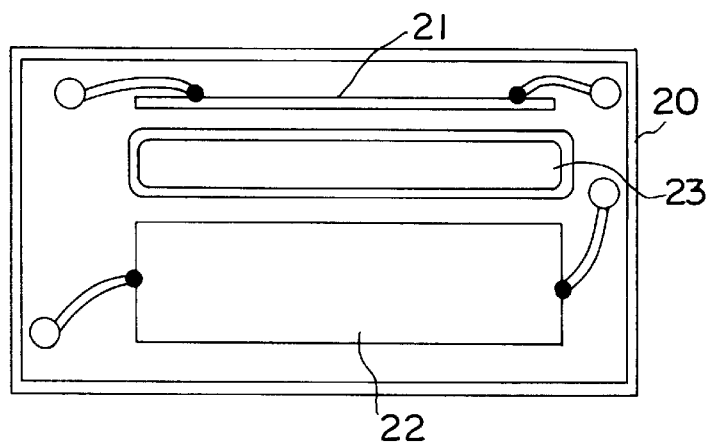
FIG. 8 is a plan view of another conventional heat resistant medium-filled type high-voltage electrical element.

As regards the arrangement of the receptacles 2 and the high-voltage resistor 5, a variety of embodiments are possible, including the variations shown in FIG. 4 or FIG. 5.

FIG. 4 shows an example in which the high-voltage resistor 5 is arranged between two receptacles 2a and 2b such that a center line normal to the plane of the resistor 5 intersects both receptacles 2a and 2b. FIG. 5 shows an example in which the high-voltage resistor 5 is arranged on a line connecting the middle points of two sides of an imaginary triangular box having its vertexes at positions where three receptacles 2c, 2d and 2e are arranged.

Due to the above-described symmetrical arrangements, the heat emanating from the high-voltage resistor 5 is substantially evenly dissipated in every direction and so the distortion due to thermal stress of the resin filling the casing 1 is reduced. It will be apparent that the object of the present invention can be achieved without the necessity of limiting the number or positions of the receptacles 2 to the above examples.

Further, each of the receptacles 2 may have cylindrical shapes other than the circular column shown, and may include alternative shapes such as a square column, a rectangular column or in any other desired shape. Moreover, in order to increase the relative area of contact with the heat resistant medium, the surface of the receptacle 2 may be corrugated or have some other complex cross-section which increases relative surface area.

In addition, although in the instant embodiments, each of the receptacles 2 is made hollow in consideration of the convenience of connection with the external lead wire and the efficiency of heat discharge, it is also possible to use a receptacle 2 which is not hollow. In this embodiment, the connection 2 of the receptacle 2 to an external lead wire is made through a particular portion of the connector.

It will be appreciated that the forgoing exemplary embodiments are illustrative of the invention, but the scope of the invention is not limited to these examples. The scope of the invention is to be determined from the claims appended hereto.

What is claimed is:

1. A high-voltage electronic device comprising:
   a housing;
   a heat resistant medium filled in the housing;
   a capacitor disposed in the housing;
   at least two hollow cylindrical receptacles disposed in the heat resistant medium, each of the hollow cylindrical receptacles having at a bottom thereof a conductive member electrically connected to the capacitor; and
   a high-voltage resistor electrically connected to the hollow cylindrical receptacles and disposed in the heat resistant medium such that the high-voltage resistor is located between the hollow cylindrical receptacles.

2. A high-voltage electronic device according to claim 1, wherein the high-voltage resistor is symmetrically arranged with respect to the hollow cylindrical receptacles such that heat generated from the high-voltage resistor is substantially evenly dissipated to the heat resistant medium in every direction.

3. A high-voltage electronic device according to claim 1, wherein the high-voltage electronic device includes four hollow cylindrical receptacles, the four hollow cylindrical receptacles are arranged at corners of an imaginary quadratic box.

4. A high-voltage electronic device according to claim 1, wherein the high-voltage electronic device includes three hollow cylindrical receptacles, the three hollow cylindrical receptacles are arranged at corners of an imaginary triangular box.

* * * * *